(12) United States Patent
Kuboi et al.

(10) Patent No.: US 8,735,859 B2
(45) Date of Patent: May 27, 2014

(54) NONVOLATILE SEMICONDUCTOR MEMORY DEVICE

(75) Inventors: Shuichi Kuboi, Tokyo (JP); Masayuki Takata, Tokyo (JP); Tsukasa Nakai, Tokyo (JP); Hiroyuki Fukumizu, Tokyo (JP); Yasuhiro Nojiri, Tokyo (JP); Kenichi Ootsuka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 41 days.

(21) Appl. No.: 13/512,774

(22) PCT Filed: Nov. 29, 2010

(86) PCT No.: PCT/JP2010/071267
§ 371 (c)(1),
(2), (4) Date: Jul. 18, 2012

(87) PCT Pub. No.: WO2011/065537
PCT Pub. Date: Jun. 3, 2011

(65) Prior Publication Data
US 2012/0273743 A1    Nov. 1, 2012

(30) Foreign Application Priority Data
Nov. 30, 2009   (JP) ................................. 2009-272927

(51) Int. Cl.
*H01L 29/02* (2006.01)

(52) U.S. Cl.
USPC ................ 257/2; 257/3; 257/4; 257/E45.001; 438/95; 438/675; 438/310

(58) Field of Classification Search
USPC ............. 257/2–5, E45.001, E45.002; 438/95, 438/675, 310
See application file for complete search history.

(56) References Cited

U.S. PATENT DOCUMENTS

| 4,599,705 A * | 7/1986 | Holmberg et al. ............ 365/163 |
| 2008/0070162 A1 | 3/2008 | Ufert |
| 2008/0099752 A1 | 5/2008 | Kreupl et al. |
| 2008/0102278 A1 | 5/2008 | Kreupl et al. |

FOREIGN PATENT DOCUMENTS

| JP | 2008 118108 | 5/2008 |
| JP | 2008-153624 | 7/2008 |
| JP | 2009 135291 | 6/2009 |
| JP | 2010 50411 | 3/2010 |

OTHER PUBLICATIONS

International Search Report Issued Feb. 1, 2011 in PCT/JP10/71267 Filed Nov. 29, 2010.

* cited by examiner

*Primary Examiner* — Mark A Laurenzi
(74) *Attorney, Agent, or Firm* — Oblon, Spivak, McClelland, Maier & Neustadt, L.L.P.

(57) ABSTRACT

A nonvolatile semiconductor memory device includes: a first interconnect; a second interconnect at a position opposing the first interconnect; and a variable resistance layer between the first interconnect and the second interconnect, the variable resistance layer being capable of reversibly changing between a first state and a second state by a voltage applied via the first interconnect and the second interconnect or a current supplied via the first interconnect and the second interconnect, the first state having a first resistivity, the second state having a second resistivity higher than the first resistivity. Wherein the variable resistance layer has a compound of carbon and silicon as a main component and including hydrogen.

7 Claims, 6 Drawing Sheets

NONVOLATILE SEMICONDUCTOR MEMORY DEVICE

TECHNICAL FIELD

Embodiments described herein relate generally to a nonvolatile semiconductor memory device.

BACKGROUND ART

A nonvolatile semiconductor memory device (a ReRAM: resistance change memory) is known that includes a resistance change element that can switch between a low resistance state and a high resistance state. Here, to reduce the probability of a misoperation (erroneous switching), a resistance change element made of carbon and having a high resistance ratio between the low resistance state and the high resistance state has been proposed.

In the case where such a resistance change material having carbon as the main component is used, it is becoming necessary to reduce not only the amount of the current flowing in the cell but also the power consumption by increasing the electrical resistivity (hereinbelow, called simply the resistivity) of the low resistance state.

However, a resistance change material that can solve both problems of reducing the power consumption (in extreme cases, avoiding destruction of the resistance change element due to the increase of the cell current) and reducing the misoperation (the erroneous switching) probability has yet to be proposed.

CITATION LIST

Patent Literature

[PLT 1]
JP 2008-118108 A (Kokai)

SUMMARY OF INVENTION

Technical Problem

An embodiment of the invention provides a nonvolatile semiconductor memory device that can reduce the probability of misoperations occurring and reduce the power consumption.

Solution to Problem

According to an aspect of the invention, a nonvolatile semiconductor memory device includes: a first interconnect; a second interconnect at a position opposing the first interconnect; and a variable resistance layer between the first interconnect and the second interconnect, the variable resistance layer being capable of reversibly changing between a first state and a second state by a voltage applied via the first interconnect and the second interconnect or a current supplied via the first interconnect and the second interconnect, the first state having a first resistivity, the second state having a second resistivity higher than the first resistivity. Wherein the variable resistance layer has a compound of carbon and silicon as a main component and including hydrogen.

DESCRIPTION OF EMBODIMENTS

Embodiments of the invention will now be illustrated with reference to the drawings. Similar components in the drawings are marked with like reference numerals, and a detailed description is omitted as appropriate. Arrow X, arrow Y, and arrow Z of the drawings illustrate mutually orthogonal directions.

Figure 1:
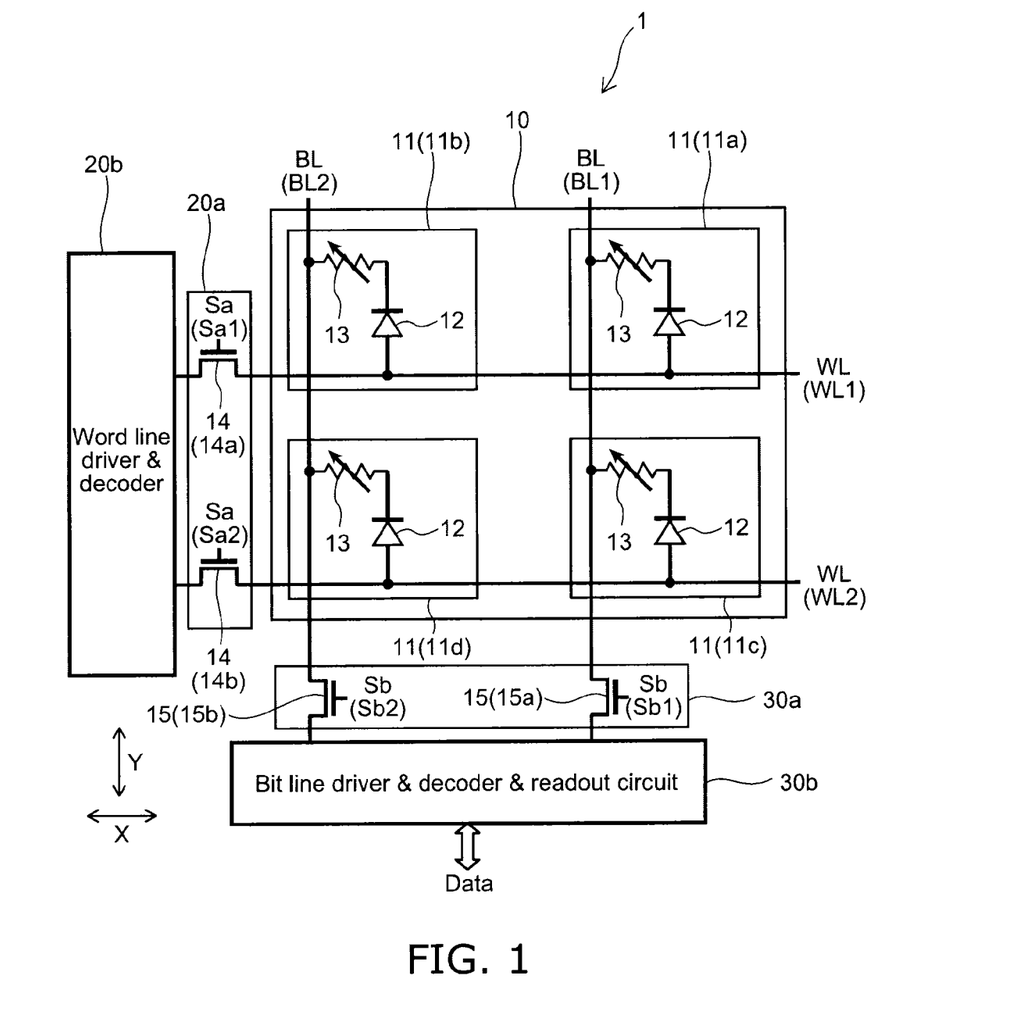
FIG. 1 is a schematic circuit diagram illustrating a nonvolatile semiconductor memory device according to this embodiment.

FIG. 1 is a schematic circuit diagram illustrating a nonvolatile semiconductor memory device 1 according to this embodiment.

Figure 2:
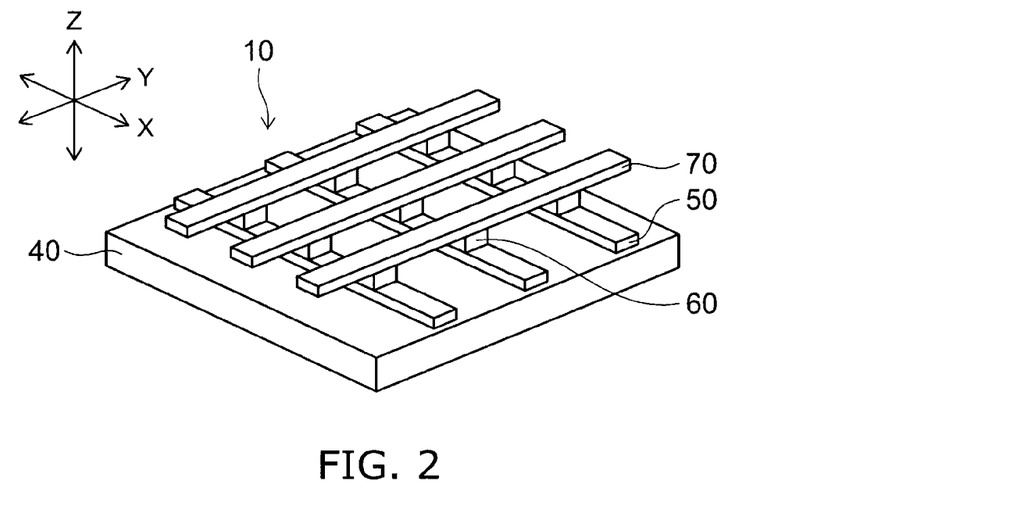
FIG. 2 is a schematic perspective view illustrating an example of a memory cell array.

FIG. 2 is a schematic perspective view illustrating an example of a memory cell array 10.

Figure 3:
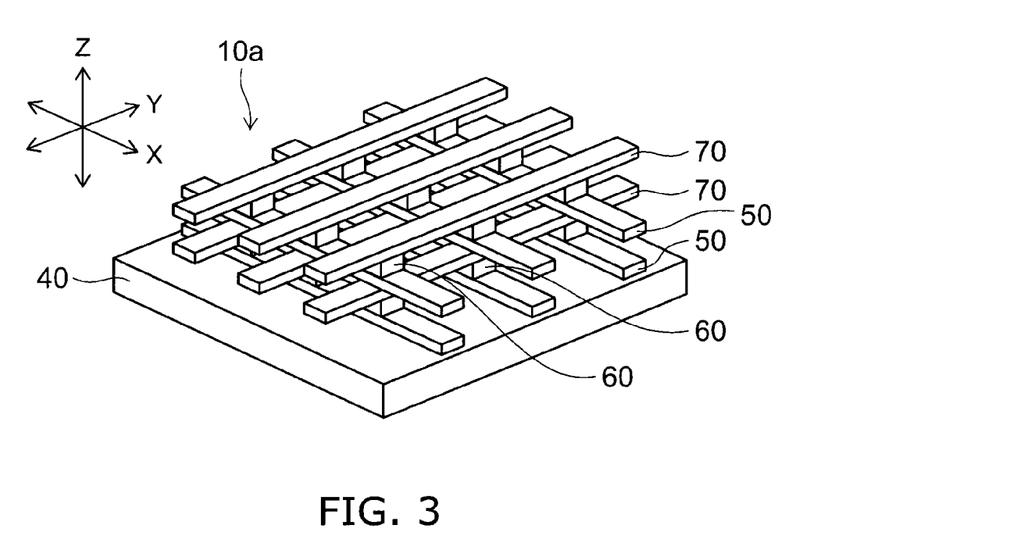
FIG. 3 is schematic perspective views illustrating examples of memory cell arrays according to other embodiments.
Figure 4:
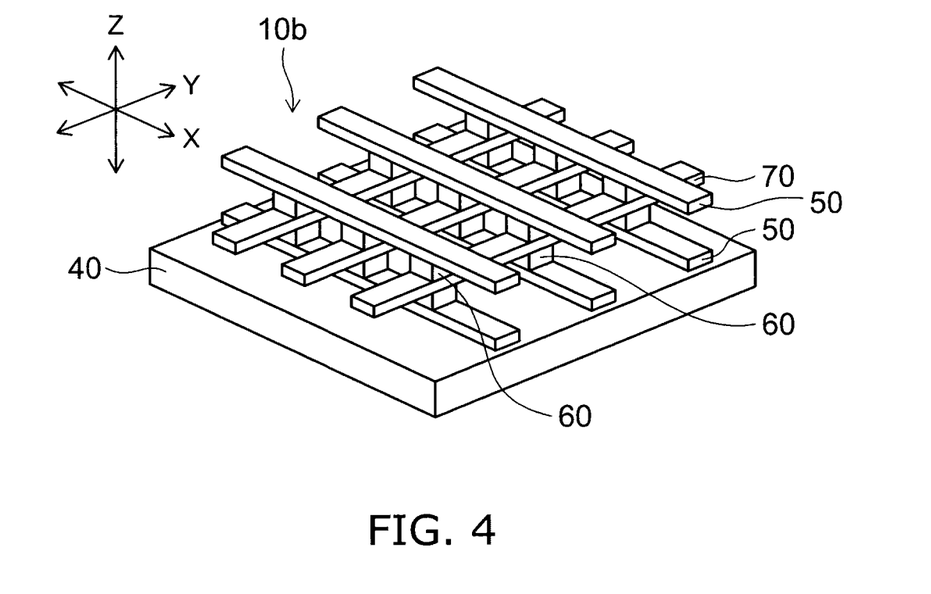
FIG. 4 is schematic perspective views illustrating examples of memory cell arrays according to other embodiments.

FIG. 3 and FIG. 4 are schematic perspective views illustrating examples of memory cell arrays according to other embodiments.

An insulating layer 66 (e.g., referring to FIG. 5) that is formed around a memory layer 60 and the like is not illustrated in FIG. 2 to FIG. 4.

As illustrated in FIG. 1, the memory cell array 10, a word line selection circuit 20a, a word line drive circuit 20b, a bit line selection circuit 30a, and a bit line drive circuit 30b are provided in the nonvolatile semiconductor memory device 1.

The memory cell array 10 includes word lines WL (WL1 and WL2) (first interconnects), bit lines BL (BL1 and BL2) (second interconnects) that intersect the word lines WL, and memory cells 11 (11a to 11d) disposed at the intersections between the word lines WL and the bit lines BL.

In other words, the word lines WL are provided; and the bit lines BL are provided at positions opposing the word lines WL.

The variable resistance layer 63 (referring to FIG. 5) is provided between the word line WL and the bit line BL, and is capable of reversibly changing between a first state and a second state by a voltage applied via the word line WL and the bit line BL or a current supplied via the word line WL and the bit line BL, where the first state has a first resistivity, and the second state has a second resistivity higher than the first resistivity.

The word lines WL are arranged at a prescribed pitch in the Y direction and are formed to extend in the X direction. The bit lines BL are arranged at a prescribed pitch in the X direction and are formed to extend in the Y direction. The memory cells 11 (11a to 11d) are disposed in a matrix configuration on a plane formed in the X direction and the Y direction.

A diode 12 and a resistance change element 13 that are connected in series are provided in each of the memory cells 11. The diode 12 is disposed to prevent sneak current when storing (programming)/reproducing (reading). The resistance change element 13 functions as the variable resistance layer 63 described below and can be repeatedly caused to change between the low resistance state and the high resistance state by an application of a voltage or a supply of a current. Then, data that is nonvolatile is stored based on the resistivities of these two states. The anode of the diode 12 is connected to the word line WL; and the cathode of the diode 12 is connected to one end of the resistance change element 13. One other end of the resistance change element 13 is connected to the bit line BL.

Multiple selection transistors 14 (14a and 14b) are provided in the word line selection circuit 20a. One end of the selection transistor 14 is connected to one end of the word line WL; and one other end of the selection transistor 14 is connected to the word line drive circuit 20b. Signals Sa (Sa1 and Sa2) are supplied to the gates of the selection transistors 14. Then, by controlling the signals Sa, the word lines WL can be selectively connected to the word line drive circuit 20b.

The voltages necessary to erase the data stored in the memory cells 11, program the data to the memory cells 11, and read the data from the memory cells 11 are applied by the word line drive circuit 20b to the word lines WL. Or, the currents necessary to erase the data, program the data, and read the data are supplied to the word lines WL.

Multiple selection transistors 15 (15a and 15b) are provided in the bit line selection circuit 30a. One end of the selection transistor 15 is connected to one end of the bit line BL; and one other end of the selection transistor 15 is connected to the bit line drive circuit 30b. Signals Sb (Sb1 and Sb2) are supplied to the gates of the selection transistors 15. Then, by controlling the signals Sb, the bit lines BL can be selectively connected to the bit line drive circuit 30b.

The voltages necessary to erase the data stored in the memory cells 11, program the data to the memory cells 11, and read the data from the memory cells 11 are applied by the bit line drive circuit 30b to the bit lines BL. Or, the currents necessary to erase the data, program the data, and read the data are supplied to the bit lines BL. The bit line drive circuit 30b outputs the data that is read via the bit lines BL to the outside.

A configuration of memory cell arrays will now be described with reference to FIG. 2 to FIG. 4.

As illustrated in FIG. 2, the memory cell array 10 has a so-called cross-point configuration in which the memory layer 60 is disposed at the intersections between the word lines WL and the bit lines BL.

The memory cell array 10 has a configuration in which a first conductive layer 50, the memory layer 60, and a second conductive layer 70 are stacked in the Z direction on a major surface of a substrate 40 in this order from the lower layer to the upper layer. Here, the first conductive layer 50 functions as the word line WL described above. The memory layer 60 functions as the memory cell 11 described above. The second conductive layer 70 functions as the bit line BL described above.

The first conductive layer 50 is formed in stripe configurations extending in the X direction at a prescribed pitch in the Y direction. The first conductive layer 50 is formed from a conductive material (e.g., a metal, etc.). The first conductive layer 50 is formed from a material having high thermal stability and a low resistivity. For example, tungsten (W), titanium (Ti), and tantalum (Ta), nitrides thereof, stacks thereof, and the like are examples.

The memory layer 60 is provided on the first conductive layer 50 and is disposed in a matrix configuration in the X direction and the Y direction.

The second conductive layer 70 is formed in stripe configurations extending in the Y direction at a prescribed pitch in the X direction. The second conductive layer 70 is formed to contact the upper surface of the memory layer 60. The second conductive layer 70 is formed from a material having high thermal stability and a low resistivity. For example, tungsten (W), titanium (Ti), and tantalum (Ta), nitrides thereof, stacks thereof, and the like are examples. The first conductive layer 50 and the second conductive layer 70 may be formed from the same material or may be formed from different materials.

Although the first conductive layer 50, the memory layer 60, and the second conductive layer 70 are provided in one layer each in the memory cell array 10 illustrated in FIG. 2, this is not limited thereto.

For example, as in a memory cell array 10a illustrated in FIG. 3, a configuration may be used in which the first conductive layer 50, the memory layer 60, and the second conductive layer 70 are further stacked in layers on (in the Z direction) the configuration of the memory cell array 10 described above with an insulating layer interposed.

Also, for example, as in a memory cell array 10b illustrated in FIG. 4, a configuration may be used in which the memory layer 60 is formed in a layer on (in the Z direction) the second conductive layer 70 of the memory cell array 10 described above, and the first conductive layer 50 is formed in a layer on (in the Z direction) this memory layer 60. In other words, as in the memory cell array 10b illustrated in FIG. 4, the memory cell array may have a configuration in which the second conductive layer 70 is shared by the memory layers 60 on and under the second conductive layer 70.

The configuration of the memory layer 60 will now be illustrated further.

Figure 5:
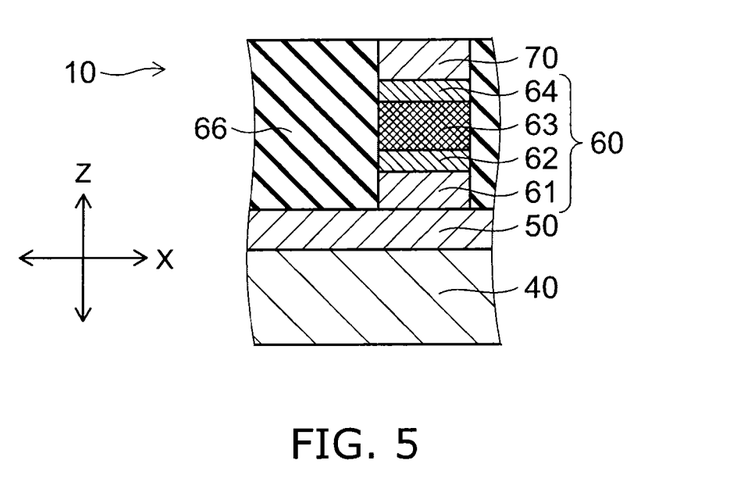
FIG. 5 is a schematic cross-sectional view illustrating the configuration of the memory layer.

FIG. 5 is a schematic cross-sectional view illustrating the configuration of the memory layer 60. FIG. 5 illustrates the cross section of the memory cell array 10 illustrated in FIG. 2.

As illustrated in FIG. 5, the memory layer 60 has a configuration in which a diode layer 61, a first electrode layer 62, the variable resistance layer 63, and a second electrode layer 64 are stacked in the Z direction in this order from the lower layer to the upper layer.

The diode layer 61 is formed in a layer on (in the Z direction) the first conductive layer 50. The diode layer 61 functions as the diode 12 described above. The diode layer 61 may include, for example, a MIM (Metal-Insulator-Metal) structure and a PIN structure (P+poly-Silicon-Intrinsic-N+poly-Silicon).

The first electrode layer 62 is formed in a layer on (in the Z direction) the diode layer 61.

The first electrode layer 62 may be formed from at least one type of metal selected from element group g1 recited below or, for example, one selected from a nitride and a carbide of element group g1 such as compound group g2. Or, the first electrode layer 62 may be formed from a mixture thereof.

Element group g1: tungsten (W), tantalum (Ta), silicon (Si), iridium (Ir), rubidium (Ru), gold (Au), platinum (Pt), palladium (Pd), molybdenum (Mo), nickel (Ni), chrome (Cr), cobalt (Co), and titanium (Ti)

Compound group g2: Ti—N, Ti—Si—N, Ta—N, Ta—Si—N, Ti—C, Ta—C, and W—N

The variable resistance layer 63 is formed in a layer on (in the Z direction) the first electrode layer 62. The variable resistance layer 63 functions as the resistance change element 13 described above. The resistivity of the variable resistance layer 63 is caused to change by at least one selected from the applied voltage and the conducted current. The film thickness of the variable resistance layer 63 may be, for example, not less than 3 nm (nanometers) and not more than 70 nm (nanometers).

The composition and the like of the variable resistance layer 63 are described below.

The second electrode layer 64 is formed between the upper surface of the variable resistance layer 63 and the lower surface of the second conductive layer 70. The second electrode layer 64 may be formed from at least one type of metal selected from element group g3 recited below or, for example, one selected from a nitride and a carbide of element group g3 such as compound group g4. Or, the second electrode layer 64 may be formed from a mixture thereof.

Element group g3: tungsten (W), tantalum (Ta), silicon (Si), iridium (Ir), rubidium (Ru), gold (Au), platinum (Pt), palladium (Pd), molybdenum (Mo), nickel (Ni), chrome (Cr), cobalt (Co), and titanium (Ti)

Compound group g4: Ti—N, Ti—Si—N, Ta—N, Ta—Si—N, Ti—C, Ta—C, and W—N

The insulating layer 66 is formed between the memory layers 60 that are disposed in a matrix configuration. The insulating layer 66 functions as a so-called inter-element insulation layer. The insulating layer 66 may be formed from an insulating material. For example, the insulating layer 66 may be formed from polyimide, a phthalocyanine organic molecular material, etc.

The composition and the like of the variable resistance layer 63 will now be illustrated further.

Here, it is favorable for the variable resistance layer 63 to be formed using a resistance change material having a high resistance ratio between the low resistance state and the high resistance state to reduce the probability of misoperation (erroneous switching). A resistance change material made of carbon is an example of a resistance change material having a high resistance ratio.

As a result of investigations, the inventors obtained knowledge relating to a resistance change material for the variable resistance layer for which the resistance ratio is high and the resistivity of the low resistance state is higher than a conventional low resistance state.

The knowledge obtained by the inventors will now be described.

According to the knowledge obtained by the inventors, to obtain the high resistance ratio and the higher resistivity of the low resistance state, it is favorable to use a material that has a compound of carbon (C) and silicon (Si) as the main component and further includes hydrogen (H), or this material plus at least one type of element selected from nitrogen (N) and oxygen (O).

In such a case, it is favorable to include a Si—C bond, a Si—(CH$_x$) bond (x being an integer), and a Si—H bond, or these bonds plus at least one type of bond selected from the group consisting of a —CH$_2$— bond, a —C=C— bond, a Si—N bond, a Si—NHx bond (x being an integer), a —NHx bond (x being an integer), and a Si—C$_6$H$_x$ bond (x being an integer). Here, C$_6$H$_x$ is a phenyl group which is a substituent of benzene.

It is also favorable for the compositional formula of Si$_x$(CaN$_b$O$_c$)$_y$H$_z$ to have ranges of the atomic ratios x, y, z, a, b, and c of $5 \leq x \leq 40$, $20 \leq y \leq 60$, $5 \leq z \leq 65$, $50 \leq a \leq 100$, $0 \leq b \leq 20$, and $0 \leq c \leq 4$.

To obtain the desired resistivity of the low resistance state, it is favorable for the resistivity of the variable resistance layer to be not less than $10^2$ Ω·cm in the case where the variable resistance layer is in the off-state (i.e., the high resistance state, and specifically, a state corresponding to the state of erasing the data and the like, an off-state of the variable resistance layer including another state, and the like) or in the case of a single-layer film of the high resistance state prior to forming.

If such a variable resistance layer is used, the probability of misoperations occurring can be reduced; and the power consumption can be reduced further. Also, the variable resistance layer can have a small film shrinkage factor due to heat and a large adhesion strength with the electrodes.

Here, a material having a compound of carbon (C) and silicon (Si) as the main component and including hydrogen (H), plus further including both nitrogen (N) and oxygen (O) is illustrated as an example. Table 1 is a table illustrating the relationship between the bonding states and composition ratios between these elements in the case where these elements, i.e., carbon (C), silicon (Si), hydrogen (H), nitrogen (N), and oxygen (O), are included.

In this case, the composition ratios were measured for the single-layer film state after the film formation by X-ray photoelectron spectroscopy (XPS: X-ray Photoelectron Spectroscopy). In X-ray photoelectron spectroscopy, in the case where hydrocarbon-type carbon is adsorbed to the surface, there is a risk that the analysis precision may decrease due to effects of the adsorption. Therefore, the analysis was performed after cleaning by using ions of an inert gas such as argon (Ar), etc., after sufficiently pulling a vacuum.

The bonding states were measured for the single-layer film state after the film formation by infrared absorption spectroscopy (IR: infrared spectroscopy) in a vacuum. Here, when determining the proportion of the bonding states, it is sufficient for the proportion of the bonding states to be derived from the surface area ratio of the peaks from peak resolution of the spectrum obtained by the infrared absorption spectroscopy.

Eleven samples were made; and the composition ratio and the bonding states were measured for each of the samples. In Table 1, the composition ratios are for the case of Si$_x$(C$_a$N$_b$O$_c$)$_y$H$_z$.

Figure 6:
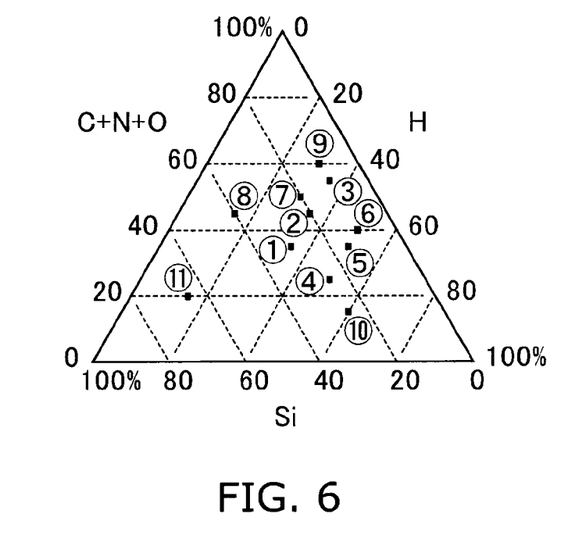
FIG. 6 is a ternary diagram (a ternary graph) illustrating the composition distributions of the samples.

FIG. 6 is a ternary diagram (a ternary graph) illustrating the composition distributions of the samples.

The numbers inside the ternary diagram (the ternary graph) are the sample numbers recited in Table 1.

TABLE 1

| SAMPLE NUMBER | COMPOSITION RATIO | | | IR BONDING STATE | | | | | | | | |
|---|---|---|---|---|---|---|---|---|---|---|---|---|
| | Si$_x$ | (C + N + O)$_y$ | H$_z$ | Si—C | Si—(CH$_x$) | Si—H | —C=C— | —CH$_2$— | Si—N | Si—NH$_x$ | —NH$_x$ | Si—C$_6$H$_x$ |
| 1 | 0.300 | 0.350 | 0.350 | YES | YES | YES | NO | YES | YES | YES | YES | NO |
| 2 | 0.200 | 0.450 | 0.350 | YES | YES | YES | NO | YES | YES | YES | YES | NO |
| 3 | 0.100 | 0.550 | 0.350 | YES | YES | YES | YES | YES | NO | NO | NO | YES |
| 4 | 0.250 | 0.250 | 0.500 | YES | YES | YES | YES | YES | YES | YES | YES | NO |
| 5 | 0.150 | 0.350 | 0.500 | YES | YES | YES | NO | YES | YES | YES | YES | NO |
| 6 | 0.100 | 0.400 | 0.500 | YES | YES | YES | NO | YES | NO | NO | NO | YES |
| 7 | 0.200 | 0.500 | 0.300 | YES | YES | YES | YES | YES | YES | YES | YES | NO |

TABLE 1-continued

| SAMPLE NUMBER | COMPOSITION RATIO | | | IR BONDING STATE | | | | | | | | |
|---|---|---|---|---|---|---|---|---|---|---|---|---|
| | $Si_x$ | $(C+N+O)_y$ | $H_z$ | Si—C | Si—(CH$_x$) | Si—H | —C=C— | —CH$_2$— | Si—N | Si—NH$_x$ | —NH$_x$ | Si—C$_6$H$_x$ |
| 8 | 0.400 | 0.450 | 0.150 | YES | YES | YES | YES | YES | YES | YES | YES | NO |
| 9 | 0.100 | 0.600 | 0.300 | YES | YES | YES | YES | YES | YES | YES | YES | NO |
| 10 | 0.300 | 0.150 | 0.650 | YES | YES | YES | YES | YES | YES | YES | YES | NO |
| 11 | 0.650 | 0.200 | 0.150 | YES | YES | YES | YES | YES | YES | YES | YES | NO |

YES: BONDED
NO: NOT BONDED

It can be seen from Table 1 that if carbon (C), silicon (Si), and hydrogen (H) are included, at least a Si—C bond, a Si—(CH$_x$) bond (x being an integer), and a Si—H bond can be included even if nitrogen (N) and/or oxygen (O)) are included. Also, by the nitrogen (N) and the oxygen (O) being included, a —CH$_2$— bond, a —C=C— bond, a Si—N bond, a Si—NH$_x$ bond (x being an integer), a —NH$_x$ bond (x being an integer), and a Si—C$_6$H$_x$ (x being an integer) can be included.

As examples, the structural formula of the Si—C bond is illustrated in [Chem. 1], the structural formula of the Si—(CH$_x$)$_x$ bond (x being an integer) is illustrated in [Chem. 2], the structural formula of the —CH$_2$— bond is illustrated in [Chem. 3], the structural formula of the —C=C— bond is illustrated in [Chem. 4], the structural formula of the Si—N bond is illustrated in [Chem. 5], the structural formula of the —NH$_x$ bond (x being an integer) is illustrated in [Chem. 6], and the structural formula of the Si—C$_6$H$_x$ bond (x being an integer) is illustrated in [Chem. 7].

The bonding states when a change of the resistivity due to a voltage application and the like occurs will now be illustrated.

It is difficult to measure the bonding states when the change of the resistivity occurs due to the voltage application and the like. Therefore, the bonding states were measured for samples in the single-layer film state before heating and after heating to not less than 500° C. by infrared absorption spectroscopy to match the temperature increase when the voltage application and the like is performed. The composition change due to desorbed species was suppressed by forming a cap layer at the surfaces of the samples in the single-layer film state.

Figure 7:
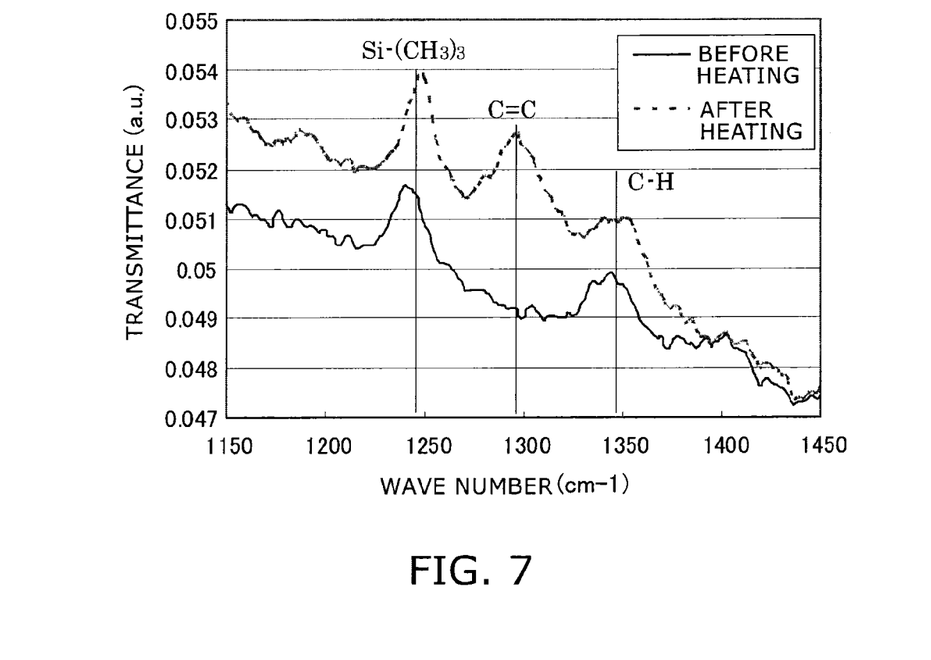
FIG. 7 is a graph illustrating the bonding states before and after the heating.

FIG. 7 is a graph illustrating the bonding states before and after the heating.

It can be seen from FIG. 7 that there are more C=C bonds after the heating than before the heating. Here, it is considered that, for example, in the variable resistance layer, C=C bonds are formed due to Joule heat and the like by applying the voltage; and the variable resistance layer is switched from the off-state (the high resistance state) to the set state (the low resistance state) by the contribution of the sp$^2$ hybridized orbital component or the component of the pi electron of the C=C bond.

As an example relating to the variable resistance layer, the case is illustrated using the structural formula of the bonds included in a portion of the variable resistance layer where [Chem. 8] of the off-state (the high resistance state) becomes [Chem. 9] of the on-state (the low resistance state) by the C=C bonds increasing. In such a case, it is considered that, for example, [Chem. 8] of the off-state (the high resistance state) becomes [Chem. 9] of the on-state (the low resistance state) by the C=C bonds increasing by the hydrogen (H) bonds breaking.

On the other hand, according to other knowledge obtained by the inventors, if the voltage is applied and the like in the case where the variable resistance layer 63 is switched to the reset state (the state of erasing the programmed data), the bonding states of the high resistivity, that is, the proportion of the Si—C bonds, can be increased by, for example, Joule heat. Therefore, it is considered that the variable resistance layer 63 can be changed from the low resistance state to the high resistance state.

Also, as an example of a resistance change model of the variable resistance layer 63, it is considered that the variable resistance layer can change between the on-state (the low resistance state) and the off-state (the high resistance state) by a reaction (here, including an oxidation-reduction reaction) occurring at the interface between the variable resistance layer 63 and the electrodes (the first electrode layer 62 and the second electrode layer 64) and/or filaments being formed in the variable resistance layer 63.

As an effect of the hydrogen (H) included in the variable resistance layer 63, for example, it is considered that the resistance change of the variable resistance layer 63 is promoted and the like by dangling bonds of the silicon (Si) and/or defects of the Si—H bonds and the like forming inside the film (e.g., the bonding state of [Chem. 8] changing to the bonding state of [Chem. 10]) due to the hydrogen (H) bonds breaking and thereby, for example, the bonding states of the variable resistance layer 63 being easily changed to the C=C bond, the reaction at the interface between the variable resistance layer 63 and the electrodes (the first electrode layer 62 and the second electrode layer 64)) being promoted, or the filaments being easily formed in the variable resistance layer 63, the atoms moving easily through the defects, and the like.

[Chem. 10]

According to other knowledge obtained by the inventors, it was ascertained that the Si—N bond, the Si—NH$_x$ bond (x being an integer), the Si—C bond, the Si—C$_6$H$_x$ bond (x being an integer), and the like contribute to the framework of the film (the variable resistance layer 63). Of these bonds, if the Si—N bond, the Si—NH$_x$ bond (x being an integer), and the —NH$_x$ bond (x being an integer) exist, the adhesion strength between the variable resistance layer 63 and the electrodes (the first electrode layer 62 and the second electrode layer 64) can be large; and the shrinkage factor of the film as the variable resistance layer can be reduced.

Table 2 is a table illustrating the relationship between the composition ratios and the adhesion strength.

Table 2 is an evaluation of the adhesion strength of the samples illustrated in Table 1. In this case, the evaluation of the adhesion strength was performed by a crosscut method based on the JIS Standard (JIS K5400).

TABLE 2

| Sample Number | Composition Ratio | | | Adhesion Strength |
|---|---|---|---|---|
| | Si$_x$ | (C + N + O)$_y$ | H$_z$ | Peeling |
| 1 | 0.300 | 0.350 | 0.350 | not peeled |
| 2 | 0.200 | 0.450 | 0.350 | not peeled |
| 3 | 0.100 | 0.550 | 0.350 | not peeled |
| 4 | 0.250 | 0.250 | 0.500 | not peeled |
| 5 | 0.150 | 0.350 | 0.500 | not peeled |
| 6 | 0.100 | 0.400 | 0.500 | not peeled |
| 7 | 0.200 | 0.500 | 0.300 | not peeled |
| 8 | 0.400 | 0.450 | 0.150 | not peeled |
| 9 | 0.100 | 0.600 | 0.300 | peeled |
| 10 | 0.300 | 0.150 | 0.650 | not peeled |
| 11 | 0.650 | 0.200 | 0.150 | not peeled |

As illustrated in Table 1, the Si—N bond, the Si—NH$_x$ bond (x being an integer), and the —NH$_x$ bond (x being an integer) are included in samples 1 to 11. Therefore, the adhesion strength between the resistance change layer and, for example, the electrodes connected to the resistance change layer can be increased.

However, even in such a case, in the case where the proportion of (C+N+O)$_y$ is high as in sample 9 of Table 2, that is, when the proportion of the carbon (C) increases to about 60% of the entirety, for example, not only is the adhesion strength weaker between the film, the electrode material, and the like but also the film is easily peeled from the electrode material and the like because the shrinkage and the hygroscopicity of the film increase due to the heat. Therefore, there is a risk that the adhesion strength between the variable resistance layer 63 and the electrodes (the first electrode layer 62 and the second electrode layer 64) may become too small in the case where the proportion of the carbon (C) is about 60% of the entirety or more.

Further, according to other knowledge obtained by the inventors, the thermal stability of the variable resistance layer 63 can be improved if the Si—N bond, the Si—NH$_x$ bond (x being an integer), and the —NH$_x$ bond (x being an integer) exist. Therefore, the film shrinkage factor due to the heat can be reduced. Therefore, if the bonding states of the Si—N bond, the Si—NH$_x$ bond (x being an integer), and the —NH$_x$ bond (x being an integer) are made to exist, the shrinkage factor of the film of the variable resistance layer 63 can be reduced; and the thermal stability of the film of the variable resistance layer 63 can be increased.

Table 3 is a table illustrating the relationship between samples 1 to 11 and the film shrinkage factors.

Table 3 evaluates the film shrinkage factors of the samples illustrated in Table 1. In such a case, when the film shrinkage factor exceeds 30%, it becomes difficult to form the film (the variable resistance layer 63) with a uniform film thickness due to the temperature distribution (the difference between the high and low temperatures). Therefore, 30% is used as the reference of the evaluation.

Samples of the single-layer film state were heated to not less than 500° C. and not more than 1000° C. in a vacuum; and the reduction amount of the film thickness was analyzed by surface analysis using a scanning electron microscope (SEM: Scanning Electron Microscope); or the reduction amount of the film thickness was analyzed by X-ray reflectivity (XRR). Then, the film shrinkage factor was determined from the reduction amount of the film thickness. The film thicknesses of the films to be measured were about 20 nm (nanometers) to 100 nm (nanometers).

TABLE 3

| Sample Number | Composition Ratio | | | Film Shrinkage Factor |
|---|---|---|---|---|
| | Si$_x$ | (C + N + O)$_y$ | H$_z$ | |
| 1 | 0.300 | 0.350 | 0.350 | 16% |
| 2 | 0.200 | 0.450 | 0.350 | 26% |
| 3 | 0.100 | 0.550 | 0.350 | 19% |
| 4 | 0.250 | 0.250 | 0.500 | 18% |
| 5 | 0.150 | 0.350 | 0.500 | 23% |
| 6 | 0.100 | 0.400 | 0.500 | 21% |
| 7 | 0.200 | 0.500 | 0.300 | 23% |
| 8 | 0.400 | 0.450 | 0.150 | 22% |
| 9 | 0.100 | 0.600 | 0.300 | 35% |
| 10 | 0.300 | 0.150 | 0.650 | 38% |
| 11 | 0.650 | 0.200 | 0.150 | 11% |

As illustrated in Table 1, the Si—N bond, the Si—NH$_x$ (x being an integer), and the —NH$_x$ bond (x being an integer) are included also in samples 9 and 10. Therefore, the film shrinkage factor due to the heat can be reduced.

However, even in such a case, when the proportion of $(C+N+O)_y$ increases to about 60% of the entirety and the proportion of $Si_x$ becomes about 10% or less of the entirety as in sample 9 of Table 3, that is, when the proportion of the carbon (C) becomes too high, the value of the film shrinkage factor undesirably exceeds 30% because the shrinkage factor of the film due to the heat increases.

Also, in the case where the proportion of the hydrogen (H) becomes about 65% or less of the entirety as in sample 10 of Table 3, when overheating occurs, the thermal shrinkage factor increases and the film shrinkage factor undesirably exceeds 30% because the hydrogen (H) easily desorbs.

In the case where the Si—N bond, the Si—$NH_x$ bond (x being an integer), and the —$NH_x$ bond (x being an integer) are not included as in samples 3 and 6, the shrinkage factor of the film due to the heat can be reduced by reducing the proportions of the carbon (C) and/or the hydrogen (H). Therefore, in the case where the Si—N bond, the Si—$NH_x$ bond (x being an integer), and the —$NH_x$ bond (x being an integer) are not included, the shrinkage factor of the film due to the heat can be made not to exceed 30% by reducing the proportion of the carbon (C) and/or the hydrogen (H).

Table 4 is a table illustrating the relationship between samples 1 to 11 and the resistivities.

Table 4 is an evaluation of the resistivities of the samples illustrated in Table 1. In this case, according to knowledge obtained by the inventors, in the case where the resistivity of the variable resistance layer in the high resistance state (i.e., specifically, a state corresponding to the state of erasing the data and the like, other off-states of the variable resistance layer, and the like) or as a single-layer film of the high resistance state prior to forming is less than $10^2$ Ω·cm, the resistivity of the variable resistance layer decreases too much when set to the low resistance state; and problems occur in that the cell current increases and the power consumption increases too much. Therefore, being not less than $10^2$ Ω·cm is used as the reference of the evaluation.

Although the resistivity can be measured by the direct current four-terminal method, the Van der Pauw method, the four-probe method, the direct current three-terminal guard ring method, and the like, the Van der Pauw method and the direct current three-terminal guard ring method were used in the measurements of Table 4.

TABLE 4

| Sample Number | Composition Ratio | | | Electrical Resistivity |
|---|---|---|---|---|
| | $Si_x$ | $(C + N + O)_y$ | $H_z$ | |
| 1 | 0.300 | 0.350 | 0.350 | >$10^2$ Ω · cm |
| 2 | 0.200 | 0.450 | 0.350 | >$10^2$ Ω · cm |
| 3 | 0.100 | 0.550 | 0.350 | >$10^2$ Ω · cm |
| 4 | 0.250 | 0.250 | 0.500 | >$10^2$ Ω · cm |
| 5 | 0.150 | 0.350 | 0.500 | >$10^2$ Ω · cm |
| 6 | 0.100 | 0.400 | 0.500 | >$10^2$ Ω · cm |
| 7 | 0.200 | 0.500 | 0.300 | >$10^2$ Ω · cm |
| 8 | 0.400 | 0.450 | 0.150 | >$10^2$ Ω · cm |
| 9 | 0.100 | 0.600 | 0.300 | >$10^2$ Ω · cm |
| 10 | 0.300 | 0.150 | 0.650 | >$10^2$ Ω · cm |
| 11 | 0.650 | 0.200 | 0.150 | >$10^2$ Ω · cm |

In the case where the proportion of $(C+N+O)_y$ is high as in sample 9 of Table 4, that is, in the case where the proportion of the carbon (C) is high, the resistivity is less than $10^2$ Ω·cm. Therefore, there is a risk that the cell current may increase and the power consumption may increase too much in the case where the proportion of the carbon (C) exceeds about 60% of the entirety.

As in sample 11 as well, it can be seen that the resistivity is less than $10^2$ Ω·cm in the case where the proportion of the silicon (Si) exceeds about 50% of the entirety. Therefore, there is a risk that the cell current may increase and the power consumption may increase too much in the case where the proportion of the silicon (Si) exceeds about 50% of the entirety. Here, sample 10 is a film that can become amorphous silicon. In other words, the amount of the carbon (C) and the like is less than 20% of the entirety. Such a film is problematic in that, although the resistivity is high, the current flows extremely poorly because the film is not crystallized, and the velocity of the current that does flow is slow. Therefore, a composition ratio that becomes amorphous silicon as in sample 10 is inappropriate for use in the variable resistance layer of the memory device.

Here, in the case where the hydrogen (H) is less than 5%, it is considered as an example that the resistance change of the variable resistance layer 63 becomes difficult because the film density increases, the dangling bonds of the silicon (Si) and/or the defects inside the film are no longer formed easily, or the reactions at the interfaces with the electrodes (the first electrode layer 62 and the second electrode layer 64) and/or the formation of the filaments is suppressed and the like.

The appropriate ranges of the composition ratios of the components, i.e., carbon (C), silicon (Si), hydrogen (H), nitrogen (N), and oxygen (O), will now be illustrated.

The inventors obtained knowledge relating to the appropriate ranges of the composition ratios as a result of further investigations of the results illustrated above.

Namely, according to knowledge obtained by the inventors, it is favorable for the compositional formula of $Si_x(C_aN_bO_c)_yH_z$ to have ranges of the atomic ratios x, y, z, a, b, and c of 5≤x≤40, 20≤y≤60, 5≤z≤65, 50≤a≤100, 0≤b≤20, and 0≤c≤4.

Thus, a material having a compound of carbon (C) and silicon (Si) as the main component and including hydrogen (H) may be used; or this material plus at least one type of element selected from nitrogen (N) and oxygen (O)) may be used.

Further, the bonds may include a Si—C bond, a Si—$(CH_x)$ (x being an integer), and a Si—H bond; and the bonds may further include at least one type of bond selected from the group consisting of a —$CH_2$— bond, a —C═C— bond, a Si—N bond, a Si—$NH_x$ bond (x being an integer), a —$NH_x$ bond (x being an integer), and a Si—$C_6H_x$ bond (x being an integer).

Also, the adhesion strength between the variable resistance layer 63 and the electrodes (the first electrode layer 62 and the second electrode layer 64) can be increased.

Further, the film shrinkage factor in the case of being heated to not less than 500° C. and not more than 1000° C. in a vacuum can be not more than 30%.

Furthermore, the resistivity of the variable resistance layer in the off-state (i.e., the high resistance state, and specifically, a state corresponding to the state of erasing the data and the like or another off-state of the variable resistance layer and the like) or as a single-layer film of the high resistance state prior to forming can be not less than $10^2$ Ω·cm.

Thereby, the resistivity of the variable resistance layer in the set state of the variable resistance layer (i.e., the low resistance state, and specifically, a state corresponding to the program state of the data and the like or another on-state of the variable resistance layer and the like) also can be higher than the conventional resistivity; and not only can the cell current be reduced but also the power consumption amount can be suppressed more than conventional power consumption.

Figure 8:
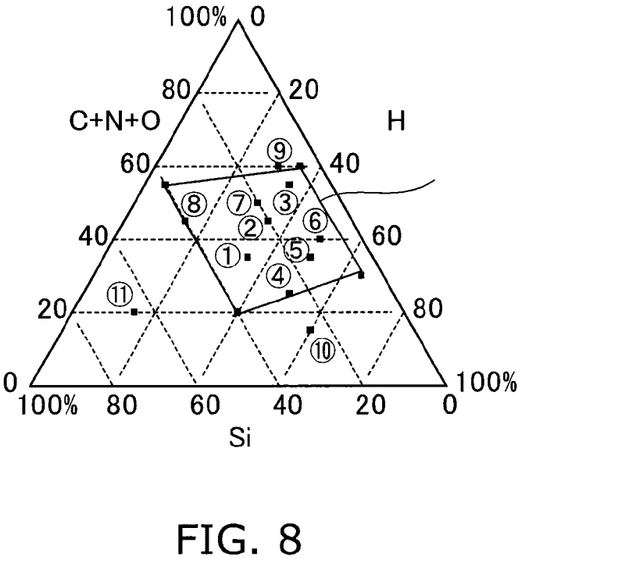
FIG. 8 is a ternary graph illustrating the appropriate ranges of the composition ratios.

FIG. 8 is a ternary graph illustrating the appropriate ranges of the composition ratios.

FIG. 8 is FIG. 6 with an appropriate range A of the composition ratios illustrated; and the numbers inside the ternary graph are the sample numbers recited in Table 1, etc.

Namely, in the range (the appropriate range A) that is illustrated, the compositional formula of $Si_x(C_aN_bO_c)_yH_z$ has the ranges of the atomic ratios x, y, z, a, b, and c of $5 \leq x \leq 40$, $20 \leq y \leq 60$, $5 \leq z \leq 65$, $50 \leq a \leq 100$, $0 \leq b \leq 20$, and $0 \leq c \leq 4$.

In this case, as described above, the adhesion strength, the film shrinkage factor, and the resistivity are appropriate for samples 1 to 8 which are included in the appropriate range A.

On the other hand, as described above, the adhesion strength and the resistivity are too small for sample 9 which is not included in the appropriate range A. Also, as described above, the film shrinkage factor is too large for sample 10 which is not included in the appropriate range A. Sample 10 is a film that can become amorphous silicon. Such a film is problematic in that, although the resistivity is high, the current flows extremely poorly because the film is not crystallized; and the velocity of the current that does flow is slow. Therefore, a film having a composition ratio for which the film becomes amorphous silicon as in sample 10 is inappropriate for use as the variable resistance layer. Further, the resistivity is too small for sample 11 which is not included in the appropriate range A.

Switching characteristics in the case where the composition ratio is within the appropriate range A will now be illustrated. Namely, an evaluation of the switching characteristics performed for samples 1 to 8 included in the appropriate range A will be illustrated.

Figure 9:
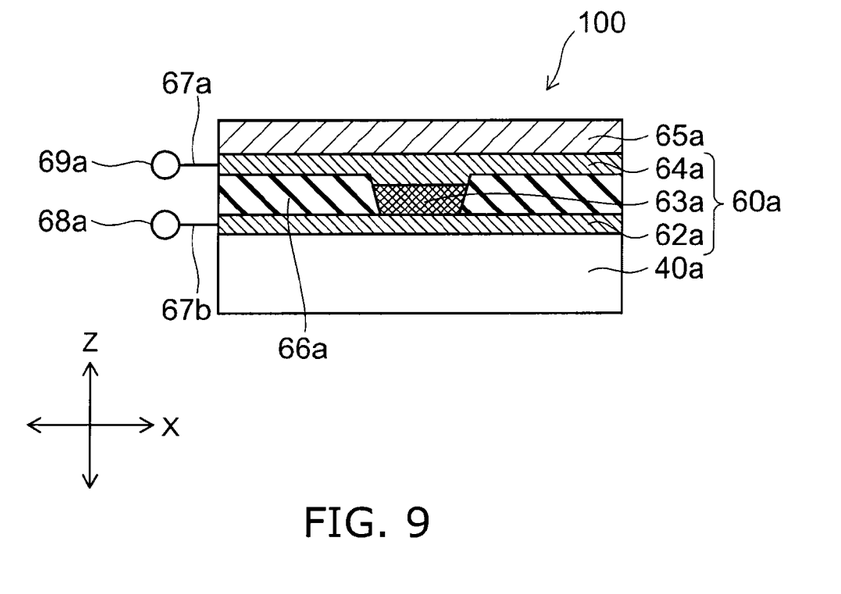
FIG. 9 is a schematic cross-sectional view illustrating the evaluation apparatus used in the evaluation of the switching characteristics.

FIG. 9 is a schematic cross-sectional view illustrating the evaluation apparatus used in the evaluation of the switching characteristics.

As illustrated in FIG. 9, a substrate 40a, a memory layer 60a, a conductive layer 65a, an insulating layer 66a, a measurement pad 68a, and a measurement pad 69a are provided in an evaluation apparatus 100.

The memory layer 60a is provided on the major surface of the substrate 40a.

The memory layer 60a has a configuration in which a first electrode layer 62a, a variable resistance layer 63a, and a second electrode layer 64a are stacked in the Z direction in this order from the lower layer to the upper layer.

The first electrode layer 62a is formed on the major surface of the substrate 40a.

The variable resistance layer 63a has a columnar configuration and is formed to extend in the stacking direction (the Z direction) from the upper surface of the first electrode layer 62a.

The second electrode layer 64a is formed in a layer on the variable resistance layer 63a and the insulating layer 66a.

The conductive layer 65a is provided to cover the upper surface of the second electrode layer 64a.

The insulating layer 66a is formed in a layer on the first conductive layer 62a around the variable resistance layer 63a side surface.

The diametrical dimensions of the measurement pad 68a and the measurement pad 69a were about 100 micrometers (μm).

The first electrode layer 62a and the measurement pad 68a are electrically connected via an interconnect 67b. The second electrode layer 64a and the measurement pad 69a are electrically connected via an interconnect 67a.

The first electrode layer 62a and the second electrode layer 64a are formed from the same materials as those of the first electrode layer 62 and the second electrode layer 64 described above.

The variable resistance layer 63a is formed from the same material as the variable resistance layer 63 described above with the same composition ratios as samples 1 to 8.

Also, an evaluation of different dimensions for the variable resistance layer 63 was performed. Specifically, evaluations were performed for a diametrical dimension of 0.25 micrometer (μm) and a height dimension of 10 nanometers (nm), for a diametrical dimension of 0.043 micrometers (μm) and a height dimension of 5 nanometers (nm), and for a diametrical dimension of 0.25 micrometers (μm) and a height dimension of 3 nanometers (nm).

The conductive layer 65a is formed from a conductor such as a metal, etc.

The insulating layer 66a is formed from silicon dioxide ($SiO_2$) and the like.

The measurement pad 68a, the measurement pad 69a, the interconnect 67a, and the interconnect 67b are formed from a conductor such as aluminum (Al), tungsten (W), etc.

If necessary, an accompanying circuit such as a protection resistor and the like may be appropriately provided.

The method of the evaluation will now be illustrated.

The evaluation of the switching characteristics was performed using a probe pair. In this case, the tips of the probe pair were sharpened to be not more than 10 nanometers (nm).

First, the probe pair is caused to contact the measurement pads 68a and 69a; and a voltage of 1 to 15 V used in the programming/erasing is applied. In such a case, the programming is performed, for example, by applying a voltage pulse of 1 to 15 V having a width of 10 nsec to 100 msec. The erasing is performed, for example, by applying a voltage pulse of 0.2 to 15 V with a width of 10 nsec to 100 msec.

The optimal values of the pulse widths during the programming/erasing differ by material and structure of the samples on which the evaluation is performed. Also, there are cases where the pulse width during the programming/erasing differs slightly between the number of switching transitions. Therefore, the optimal pulse widths within the ranges described above were selected for the evaluation.

Then, the switching characteristics are evaluated by performing reading after the programming or the erasing. The reading is performed by applying a voltage pulse having a pulse width of 10 to 1000 nsec and a voltage of about 0.1 to 0.5 V via the probe pair and by measuring the resistivity, the current, the voltage, and the like of the memory layer 60a.

The evaluation results will now be illustrated.

First, the evaluation results of the switching characteristics will be illustrated for a diametrical dimension of 0.25 micrometers (μm), a height dimension of 10 nanometers (nm), and composition ratios that were the same as those of samples 1 to 8.

For the variable resistance layer, the resistivity of the variable resistance layer in the reset state (i.e., the high resistance state, and specifically, a state corresponding to the state of erasing the data and the like or another off-state of the variable resistance layer and the like) was not less than $10^4 \Omega \cdot cm$; and the resistivity of the variable resistance layer in the set state (i.e., the low resistance state, and specifically, a state corresponding to the program state of the data and the like or another on-state of the variable resistance layer and the like) was not less than $10^2 \Omega \cdot cm$. This means that the probability of misoperation (erroneous switching) can be reduced and low power consumption is possible.

Here, because the resistivity of the variable resistance layer in the set state (i.e., the low resistance state, and specifically, a state corresponding to the program state of the data and the like or another on-state of the variable resistance layer and the like) is not less than $10^2$ Ω·cm, the cell current can be kept within the appropriate range; and the power consumption can be reduced.

Also, a cycle life of not less than ten thousand cycles could be realized.

The evaluation results of the switching characteristics will now be illustrated for a diametrical dimension of 0.043 micrometers (μm), a height dimension of 5 nanometers (nm), and composition ratios that were the same as those of samples 1 to 8.

For the variable resistance layer, the resistivity of the variable resistance layer in the reset state (i.e., the high resistance state, and specifically, a state corresponding to the state of erasing the data and the like or another off-state of the variable resistance layer and the like) was not less than $10^4$Ω·cm; and the resistivity of the variable resistance layer in the set state (i.e., the low resistance state, and specifically, a state corresponding to the program state of the data and the like or another on-state of the variable resistance layer) was not less than $10^2$ Ω·cm. This means that the probability of misoperation (erroneous switching) can be reduced and low power consumption is possible.

Here, the resistivity in the set state (i.e., the low resistance state, and specifically, a state corresponding to the program state of the data and the like or another on-state of the variable resistance layer) is not less than $10^2$ Ω·cm; the cell current can be kept within the appropriate range; and the power consumption can be reduced.

Further, a cycle life of not less than ten thousand cycles could be realized.

The evaluation results of the switching characteristics will now be illustrated for a diametrical dimension of 0.25 μm, a dimension of the height of 3 nm, and composition ratios that were the same as those of samples 1 to 8 described above.

For the variable resistance layer, the resistivity of the variable resistance layer in the reset state (i.e., the high resistance state, and specifically, a state corresponding to the state of erasing the data and the like or another off-state of the variable resistance layer) was not less than $10^4$Ω·cm; and the resistivity of the variable resistance layer in the set state (i.e., the low resistance state, and specifically, a state corresponding to the program state of the data and the like or another on-state of the variable resistance layer) was not less than $10^2$ Ω·cm. This means that the probability of misoperation (erroneous switching) can be reduced and low power consumption is possible.

Here, the resistivity in the set state (i.e., the low resistance state, and specifically, a state corresponding to the program state of the data and the like or another on-state of the variable resistance layer) is not less than $10^2$ Ω·m; the cell current can be kept within the appropriate range; and the power consumption can be reduced.

Further, a cycle life of not less than ten thousand cycles could be realized.

As illustrated above, good switching characteristics are possible even in the case where the composition ratio was within the appropriate range A illustrated in FIG. 8.

Further, according to other knowledge obtained by the inventors, the film shrinkage factor due to the heat and the variation ratio of the switching characteristics can be reduced if the dangling bond density of the silicon (Si) is increased. Also, if the Si—H bonding amount is increased, the film shrinkage factor due to the heat and the variation ratio of the switching characteristics can be reduced.

As an example hereinbelow, effects of the case where both the dangling bond density of the silicon (Si) and the Si—H bonding amount are changed will be illustrated.

For example, in the case where the dangling bond density of the silicon (Si) is increased by 10% and the Si—H bonding amount is increased by 60%, the film shrinkage factor due to the heat can be reduced by about 7%.

Further, a program voltage fluctuation Vset-σ, a program current fluctuation Iset-σ, and an erase current fluctuation Ireset-σ can be reduced if the dangling bond density of the silicon (Si) is increased and the Si—H bonding amount is increased. In other words, the variation ratio of the switching characteristics can be reduced if the dangling bond density of the silicon (Si) is increased and the Si—H bonding amount is increased.

For example, in the case where the dangling bond density of the silicon (Si) is increased by 10% and the Si—H bonding amount is increased by 60%, the program voltage fluctuation Vset-σ can be reduced by about 67%.

In such a case, the program current fluctuation Iset-σ can be reduced by about 38%; and the erase current fluctuation Ireset-σ can be reduced by about 49%.

As described above, if at least one selected from the dangling bond density of the silicon (Si) and the Si—H bonding amount is increased in the variable resistance layer, improvement of the switching characteristics and the film shrinkage factor due to the heat can be realized. Therefore, the probability of misoperations occurring can be reduced; and the power consumption can be reduced.

Effects of the nonvolatile semiconductor memory device 1, that is, the case where the programming operation, the read-out operation, and the erasing operation are executed for the memory cell 11, will now be illustrated.

As an example, the case will be illustrated where a memory cell 11a illustrated in FIG. 1 is selected and the various operations are executed for the memory cell 11a. The case is illustrated where the programming operation and the erasing operation are executed by applying the prescribed voltage to the memory cell 11a.

First, the programming operation (the set operation) will be illustrated.

In the programming operation, the potential of the selected word line WL1 is set to be relatively higher than the potential of the selected bit line BL1. For example, if the bit line BL1 is set to have the grounding potential, it is sufficient for a positive potential to be applied to the word line WL1.

Thus, when the prescribed voltage is applied to the selected memory cell 11a, a potential gradient occurs and a current pulse flows inside the memory cell 11a. The resistance of the resistance change element 13 changes from the high resistance state to the low resistance state due to this current pulse.

The pulse width of the voltage applied to the word line WL1 during the programming operation may be longer than the pulse width of the voltage applied during the erasing operation. In other words, the voltage is applied to the word line WL1 for a longer time during the programming operation than during the erasing operation.

During the programming operation, it is desirable for the unselected word line WL2 and the unselected bit line BL2 to be biased such that the unselected word line WL2 and the unselected bit line BL2 all have the same potential. Also, it is desirable for all of the word lines WL1 and WL2 and all of the bit lines BL1 and BL2 to be pre-charged in the standby prior to the programming operation.

The erasing operation (the reset operation) will now be illustrated.

In the erasing operation, the potential of the selected word line WL1 is set to be relatively higher than the potential of the selected bit line BL1. For example, it is sufficient for a positive potential to be applied to the word line WL1 if the bit line BL1 is set to have the grounding potential.

Thus, when a large current pulse flows in the selected memory cell 11a, the erasing operation is executed by the Joule heat occurring due to the large current pulse and the residual heat. Or, the erasing operation is executed by the applied voltage or the electrical current energy itself due to the large current pulse described above. In the erasing operation, the resistance change element 13 resistance changes from the low resistance state to the high resistance state.

As described above, the pulse width of the voltage applied to the word line WL1 during the erasing operation may be shorter than the pulse width of the voltage applied during the programming operation. In other words, the voltage applied to the word line WL1 is applied for a shorter time during the erasing operation than during the programming operation.

Thus, by selectively using the pulse width during the erasing operation and the pulse width during the programming operation, the erasing operation and the programming operation can be executed while discriminating between the erasing operation and the programming operation.

The read-out operation will now be illustrated.

In the read-out operation, the current pulse (the read-out current pulse) is applied to the selected memory cell 11a from the selected bit line BL1. Then, in the bit line drive circuit 30b, the read-out operation is executed by the current being read from the bit line BL1 and the resistivity of the memory cell 11a being measured. However, the current pulse (the read-out current pulse) applied to the memory cell 11a has a value that is micro enough not to cause a resistance change of the material included in the memory cell 11a.

A method for manufacturing the nonvolatile semiconductor memory device according to this embodiment will now be illustrated.

As an example, the method for manufacturing the nonvolatile semiconductor memory device 1 including the memory cell array 10 illustrated in FIG. 2 will be illustrated.

FIG. 10 is a schematic cross-sectional view of a process, illustrating the method for manufacturing the nonvolatile semiconductor memory device.

Figure 10A:
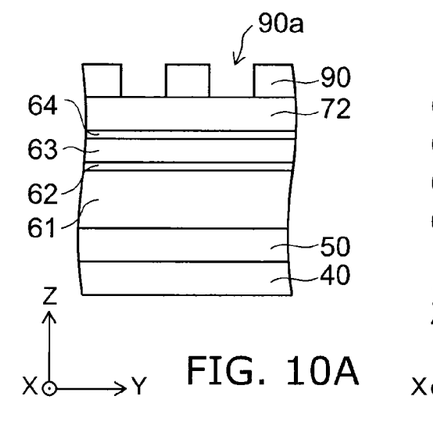
FIGS. 10A to 10F are schematic cross-sectional views of a process, illustrating the method for manufacturing the nonvolatile semiconductor memory device.

First, as illustrated in FIG. 10A, the first conductive layer 50, the diode layer 61, the first electrode layer 62, the variable resistance layer 63, the second electrode layer 64, a stopper layer 72, and an etching mask 90 are formed on the major surface of the substrate 40 in this order from the bottom. In other words, a stacked body is formed in which each of the layers are stacked in a direction (the Z-axis direction) substantially perpendicular to the first direction (the X-axis direction) and the second direction (the Y-axis direction). An opening 90a extending in the first direction (the X-axis direction) is provided in the etching mask 90.

Figure 10B:
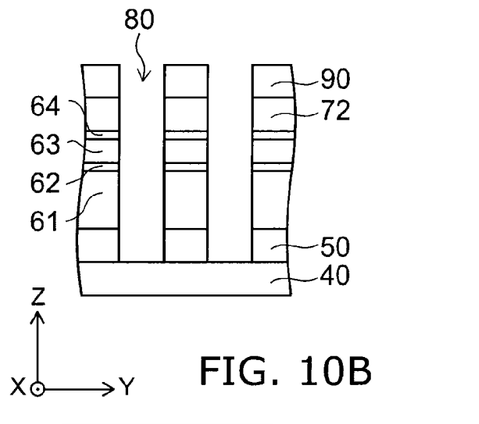

Then, as illustrated in FIG. 10B, an element-separating region 80 is made by performing etching of the stacked body (which includes the first conductive layer 50 to the etching mask 90 in the stacked state). In other words, the first element-separating region 80 is made in the stacked body by performing the etching via the opening 90a of the etching mask 90. The etching is performed to the depth of the interface between the substrate 40 and the first conductive layer 50.

Figure 10C:
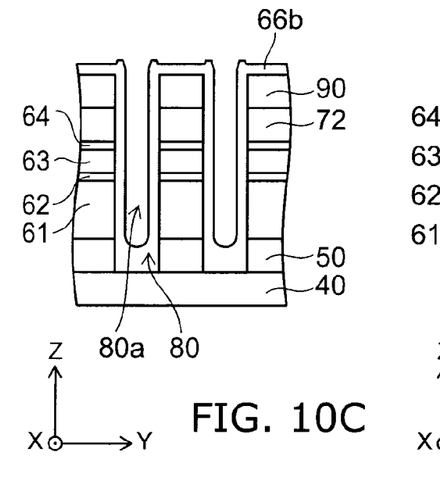

Continuing as illustrated in FIG. 10C, a first insulating layer 66b is formed on the surface where the element-separating region 80 is made by, for example, plasma CVD (Chemical Vapor Deposition). For example, SiH$_4$/O$_2$ is an example of the source-material gas. Thereby, a high-quality insulating layer having few impurities can be formed on the side walls including the side surfaces of the variable resistance layer 63 and the diode layer 61.

The first insulating layer 66b is formed on the surface of the element-separating region 80 and the major surface of the etching mask 90. Therefore, a trench 80a is made in the element-separating region 80 and at the proximity of the element-separating region 80.

Figure 10D:
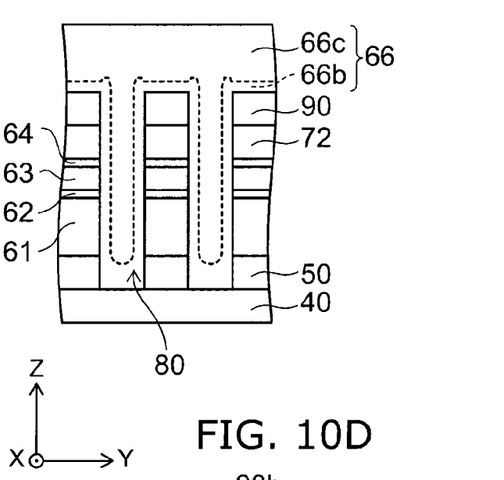

Then, as illustrated in FIG. 10D, a second insulating layer 66c is formed on the surface of the first insulating layer 66b by, for example, spin coating. For example, polysilazane and the like are examples of the coating agent used at this time. The element-separating region 80 is filled with the first insulating layer 66b and the second insulating layer 66c when the second insulating layer 66c is formed by the coating agent being filled into the trench 80a. In other words, the insulating layer 66 is formed in the element-separating region 80. Thus, the insulating layer 66 is formed in the first direction (the X-axis direction).

Figure 10E:
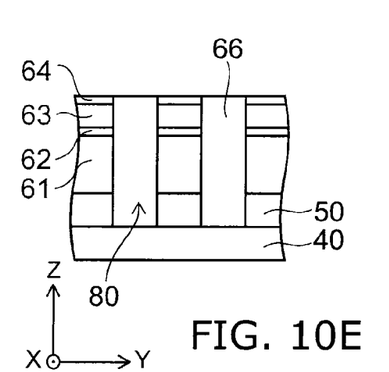

Continuing as illustrated in FIG. 10E, the upper surface of the stacked body is planarized by, for example, CMP. The planarizing is performed until the stopper layer 72 is gone. In other words, the second electrode layer 64 is exposed by planarizing the major surface of the stacked body on which the material used to form the insulating layer 66 is deposited. In the case where the stopper layer 72 and the second conductive layer 70 are a single body, the end point of the planarizing may be when the stopper layer 72 is exposed.

Figure 10F:
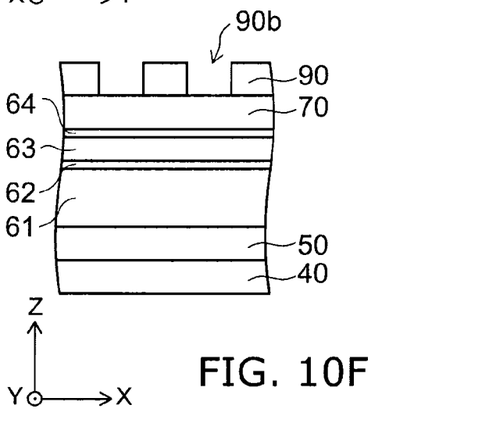

Then, as illustrated in FIG. 10F, the second conductive layer 70 and the etching mask 90 are formed on the upper surface of the stacked body in this order from the bottom. An opening 90b extending in the second direction (the Y-axis direction) is provided in the etching mask 90.

Continuing similarly to the description recited above, the formation of the element-separating region 80 and the insulating layer 66, the planarizing, etc., are performed.

In other words, first, the element-separating region 80 is made by performing etching via the opening 90b of the etching mask 90. The etching is performed to the depth of the interface between the second electrode layer 64 and the second conductive layer 70. Then, the insulating layer 66 is formed by spin coating and the like. Then, the second conductive layer 70 is exposed by planarizing the upper surface of the stacked body by, for example, CMP.

Thus, the first conductive layer 50 which is the word line WL, the diode layer 61, the first electrode layer 62, the variable resistance layer 63, the second electrode layer 64, and the second conductive layer 70 which is the bit line BL are patterned into the desired configuration. As illustrated in FIG. 3 and FIG. 4, in the case where the memory cell array has a stacked structure, it is sufficient to repeat the method described above.

Here, for example, sputtering, CVD (Chemical Vapor Deposition) (heat CVD and plasma CVD) and the like are examples of the method for forming the first conductive layer 50, the diode layer 61, the first electrode layer 62, the second electrode layer 64, the stopper layer 72, and the second conductive layer 70.

The variable resistance layer 63 may be formed, for example, as follows.

CVD (Chemical Vapor Deposition) (heat CVD and plasma CVD), vapor deposition, doping, sputtering, and the like may be used to form the variable resistance layer 63. In other words, in the process of forming the variable resistance layer 63, the variable resistance layer 63 may be formed by one type selected from the group consisting of CVD, vapor deposition, doping, and sputtering. Then, in the process of forming the variable resistance layer 63, the variable resistance layer 63 can be formed to include at least carbon, silicon, and hydrogen.

In the CVD, a silane ($SiH_4$)-type gas including a methyl group or a phenyl group may be used independently; or at least one type of gas selected from an ammonia ($NH_3$)-type and a hydrocarbon (CH)-type may be used by being mixed with the silane ($SiH_4$)-type gas.

If such gases are used, by causing the hydrogen (H), the nitrogen (N), the oxygen (O)), etc., included in these gases to react with a portion of the film, the hydrogen (H), nitrogen (N), oxygen (O)), etc., can be introduced to the film; and a mixture of an oxide or a nitride can be formed. Also, gases such as helium (He), argon (Ar), nitrogen ($N_2$), and the like may be used as the carrier gas.

Here, according to knowledge obtained by the inventors, in the case where the variable resistance layer 63 is formed using a silane ($SiH_4$)-type gas and ammonia ($NH_3$), the dangling bond density of the silicon (Si) can be increased if the proportion of the ammonia ($NH_3$) is reduced.

For example, sample 13 described above is the case where the variable resistance layer 63 is formed from only the silane ($SiH_4$)-type gas without adding the ammonia ($NH_3$).

Therefore, from the viewpoint of increasing the dangling bond density of the silicon (Si), it is favorable for the proportion of the ammonia ($NH_3$) to be reduced.

However, the film shrinkage factor due to the heat can be reduced further if the ammonia ($NH_3$) is added.

Therefore, the proportion of the ammonia ($NH_3$) may be determined by considering further increasing the dangling bond density of the silicon (Si) and further reducing the film shrinkage factor due to the heat.

Although there are several methods for CVD, plasma CVD (PECVD) is favorable because the film can be formed at a relatively low temperature of not more than 500° C. In such a case, the frequency of the plasma may be the normal commercially-used frequency band (13.56 MHz); or the band of a lower frequency may be used.

In the vapor deposition, the variable resistance layer 63 may be formed by vaporizing a liquid source material and condensing this source material. Thus, various variations are possible because the components can be adjusted in the liquid state and it is possible to mix with another gas after vaporizing. Therefore, it is possible to increase the degrees of freedom of the formation of the film.

In the doping, the variable resistance layer 63 may be formed by, for example, doping a film having main components of carbon (C) and hydrogen (H) with silicon (Si) or with silicon (Si) and nitrogen (N). Thermal diffusion, ion implantation, and the like may be used as the method for doping.

In the sputtering, a sputtering target made of silicon carbide (SiC) and the like may be used. In such a case, hydrogen (H), nitrogen (N), and oxygen (O)) cannot be introduced to the film that is formed because an inert gas such as argon (Ar) or the like is used as the sputtering gas. Therefore, to introduce hydrogen (H), nitrogen (N), and oxygen (O)) to the film, a gas including hydrogen (H), nitrogen (N), and oxygen (O)) is introduced as the reactant gas. For example, a hydrocarbon (CH)-type gas and the like are examples of the reactant gas. Although several methods may be used in the sputtering, magnetron sputtering is favorable because magnetron sputtering has excellent suitability for mass production.

In the nonvolatile semiconductor memory device 1 according to this embodiment, the variable resistance layer 63 is formed from a material having a compound of carbon (C) and silicon (Si) as the main component and including hydrogen (H), or this material plus at least one type of element selected from nitrogen (N) and oxygen (O)). These materials have a Si—C bond, a Si—($CH_x$) bond (x being an integer), and a Si—H bond as the bonding states and may further include at least one type of bonding state selected from the group consisting of a Si—C bond, a Si—($CH_x$) bond (x being an integer), a Si—H bond, a —$CH_2$— bond, a —C=C— bond, a Si—N bond, a Si—$NH_x$ bond (x being an integer), a —$NH_x$ bond (x being an integer), and a Si—$C_6H_x$ bond (x being an integer). The components of the compound of the variable resistance layer 63 described above have the compositional formula of $Si_x(C_aN_bO_c)_yH_z$ having ranges of the atomic ratios x, y, z, a, b, and c of $5 \leq x \leq 40$, $20 \leq y \leq 60$, $5 \leq z \leq 65$, $50 \leq a \leq 100$, $0 \leq b \leq 20$, and $0 \leq c \leq 4$. Further, the variable resistance layer 63 is formed from a variable resistance layer such that a resistivity in the off-state (the high resistance state) or as a single-layer film in the high resistance state prior to forming is not less than $10^2$ Ω·cm and more favorably not less than $10^4$ Ω·cm.

Therefore, according to the nonvolatile semiconductor memory device 1 according to this embodiment, programming or erasing is possible using a voltage that is lower than that of a conventional nonvolatile semiconductor memory device. Also, the difference of the resistivity of the programming/erasing can be not less than $10^2$ Ω·cm and more favorably not less than $10^4$ Ω·cm. As a result, the power consumption can be reduced and the probability of misoperations occurring can be reduced.

The resistance change layer 63 that is included can have a small film shrinkage factor due to the heat and a large adhesion strength with the electrodes. Therefore, the yield, the productivity, and the like can be improved. The quality such as the reliability, etc., also can be improved.

In such a case, if cross-point nonvolatile semiconductor memory devices 1 such as those illustrated in FIG. 2 to FIG. 4 are used, higher integration is possible because it is unnecessary to provide a MOS transistor individually for each of the memory cells 11.

Further, according to the method for manufacturing the nonvolatile semiconductor memory device according to this embodiment, the nonvolatile semiconductor memory device 1 including the variable resistance layer 63 having the configuration and the effects described above can be efficiently manufactured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

For example, the configurations, the dimensions, the numbers, the dispositions, and the like of the components included in the nonvolatile semiconductor memory device 1 are not limited to those illustrated and may be modified appropriately.

Although the memory layer 60 is illustrated as including the diode layer 61, this is not limited thereto. For example, if the electrical resistance of the variable resistance layer 63 is configured to change in the application direction of the voltage, the diode layer 61 can be omitted.

Although the second electrode layer 64 is provided on the upper surface of the variable resistance layer 63 of the memory layer 60, this is not limited thereto. For example, if the resistivity of the variable resistance layer 63 is configured to change due to Joule heat, a heater layer may be provided between the variable resistance layer 63 and the second electrode layer 64. In such a case, the heater layer may be a layer caused to generate heat by applying a voltage.

Further, the nonvolatile semiconductor memory device 1 according to this embodiment may be provided as a recording medium in various electric appliances and the like. For example, the nonvolatile semiconductor memory device 1 may be provided as a readable recording medium in a personal computer. If the nonvolatile semiconductor memory device 1 according to this embodiment is provided as a recording medium, the bit density can be higher and the power consumption can be lower compared to the case where a HDD (hard disk drive), a flash memory, or the like is provided.

REFERENCE SIGNS LIST 1 nonvolatile semiconductor memory device
10 memory cell array
11 memory cells
12 diode
13 resistance change element
20a word line selection circuit
20b word line drive circuit
30a bit line selection circuit
30b bit line drive circuit
40 substrate
50 first conductive layer
60 memory layer
61 diode layer
62 first electrode layer
63 variable resistance layer
64 second electrode layer
66 insulating layer
70 second conductive layer
80 element-separating region
90 etching mask
BL bit lines
WL word lines

The invention claimed is:

1. A nonvolatile semiconductor memory device, comprising:
   a first interconnect;
   a second interconnect at a position opposing the first interconnect; and
   a variable resistance layer between the first interconnect and the second interconnect, the variable resistance layer being capable of reversibly changing between a first state and a second state by a voltage applied via the first interconnect and the second interconnect or a current supplied via the first interconnect and the second interconnect, the first state having a first resistivity, the second state having a second resistivity higher than the first resistivity,
   wherein the variable resistance layer having a compositional of Si(CNO)H.

2. The nonvolatile semiconductor memory device according to claim 1, wherein the variable resistance layer includes a Si—C bond, a Si—(CH$_x$) bond (x being an integer), and a Si—H bond.

3. The nonvolatile semiconductor memory device according to claim 1, wherein the variable resistance layer includes at least one type selected from the group consisting of a —CH$_2$— bond, a —C═C— bond, a Si—N bond, a Si—NH$_x$ bond (x being an integer), a —NH$_x$ bond (x being an integer), and a Si—C$_6$H$_x$ bond (x being an integer).

4. The nonvolatile semiconductor memory device according to claim 1, wherein the variable resistance layer has a compositional formula of Si$_x$(C$_a$N$_b$O$_c$)$_y$H$_z$, having ranges of the atomic ratios x, y, z, a, b, and c of $5 \leq x \leq 40$, $20 \leq y \leq 60$, $5 \leq z \leq 65$, $50 \leq a \leq 100$, $0 \leq b \leq 20$, and $0 \leq c \leq 4$.

5. The nonvolatile semiconductor memory device according to claim 1, wherein the variable resistance layer has more —C═C— bonding states in the first state than in the second state and more Si—C bonding states in the second state than in the first state.

6. The nonvolatile semiconductor memory device according to claim 1, wherein a resistivity of the variable resistance layer in a state of erasing is not less than $10^2$ Ω·cm.

7. The nonvolatile semiconductor memory device according to claim 1, wherein a resistivity of the variable resistance layer in a state prior to forming is not less than $10^2$ Ω·cm.

* * * * *